(12) United States Patent
Yoon et al.

(10) Patent No.: US 8,374,024 B2
(45) Date of Patent: Feb. 12, 2013

(54) SYSTEM FOR HANDLING DATA IN A SEMICONDUCTOR MEMORY APPARATUS

(75) Inventors: Tae Hun Yoon, Icheon-si (KR); Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 234 days.

(21) Appl. No.: 12/982,996

(22) Filed: Dec. 31, 2010

(65) Prior Publication Data
US 2012/0051127 A1    Mar. 1, 2012

(30) Foreign Application Priority Data

Aug. 27, 2010 (KR) .................... 10-2010-0083295

(51) Int. Cl.
*G11C 11/00* (2006.01)
(52) U.S. Cl. .............. 365/163; 365/189.15; 365/210.1
(58) Field of Classification Search ............... 365/163, 365/148, 189.15, 189.17, 210.1, 113
See application file for complete search history.

(56) References Cited

U.S. PATENT DOCUMENTS

| | | | |
|---|---|---|---|
| 6,791,859 B2 | 9/2004 | Hush et al. | |
| 6,954,385 B2 | 10/2005 | Casper et al. | |
| 7,339,815 B2* | 3/2008 | Wicker | 365/148 |
| 7,515,461 B2 | 4/2009 | Happ et al. | |
| 7,633,788 B2* | 12/2009 | Choi et al. | 365/148 |
| 7,815,408 B2* | 10/2010 | Sessa | 411/353 |
| 2004/0145939 A1* | 7/2004 | Yoshida et al. | 365/145 |
| 2006/0034112 A1 | 2/2006 | Oh et al. | |
| 2009/0225590 A1 | 9/2009 | Oh et al. | |
| 2010/0118593 A1 | 5/2010 | Cho et al. | |

FOREIGN PATENT DOCUMENTS

| | | |
|---|---|---|
| KR | 10-0843144 B1 | 6/2008 |
| KR | 1020080057659 A | 6/2008 |
| KR | 1020090026632 A | 3/2009 |
| KR | 100924206 B1 | 10/2009 |

* cited by examiner

*Primary Examiner* — Gene Auduong
(74) *Attorney, Agent, or Firm* — William Park & Associates Ltd.

(57) ABSTRACT

A semiconductor memory apparatus includes a memory cell, a data transfer unit configured to adjust an access to the memory cell according to a voltage level of a selection signal, a selection signal output unit configured to output the selection signal having a first control voltage level in a data write mode and a second control voltage level in a data read mode. A data detection unit may also be configured to detect a voltage formed by a sensing current supplied to the memory cell through the data transfer unit in the data read mode, and output read data according to the detection result, wherein the second control voltage level is lower than the first control voltage level.

20 Claims, 2 Drawing Sheets

SYSTEM FOR HANDLING DATA IN A SEMICONDUCTOR MEMORY APPARATUS

CROSS-REFERENCES TO RELATED APPLICATION

The present application claims priority under 35 U.S.C. §119(a) to Korean application number 10-2010-0083295, filed on Aug. 27, 2010, in the Korean Intellectual Property Office, which is incorporated herein by reference in its entirety.

BACKGROUND

1. Technical Field

The present invention relates to a semiconductor memory apparatus, and more particularly, to a system for handling data in a semiconductor memory apparatus.

2. Related Art

A phase change random access memory (PCRAM) is a non-volatile memory apparatus which programs a memory cell through a programming current.

A PCRAM has characteristics of a random access non-volatile memory. Also, the PCRAM can be highly integrated at a low cost. The PCRAM stores data by using a phase change material. Specifically, the PCRAM stores data by using properties for different phases of a phase change material. The phase change material may be at different phases depending on the temperature of the phase change material.

The phase change material can change to either an amorphous state or a crystalline state at different temperature of the phase change material. A representative phase change material is a chalcogenide alloy, such as, for example, $Ge_2Sb_2Te_5$ composed of germanium (Ge), antimony (Sb), and tellurium (Te). Hence, a phase change material is generally called a "GST."

When GST is in a crystalline phase and it is heated to a melting point, its crystallinity is lost. Once cooled, it is frozen into an amorphous glass-like state and its electrical resistance is high. By heating the GST to a temperature above its crystallization point, but below the melting point, the GST will transform into a crystalline state with a much lower resistance. The low resistance crystalline state is referred to as a set state and the high resistance amorphous state is referred to as a reset state.

The PCRAM stores data in memory cells, where each memory cell comprises a circuit element made of GST. The GST is changed to the desired phase by sending an appropriate programming current through the GST to apply Joule heating sufficient to reach temperatures needed to change the phase of the GST. Reading the stored data is accomplished by sending a current through the selected phase change material, where the current is not enough to change the phase of the GST.

Since a memory cell has different resistance depending on the phase it is in, a given current will result in different voltage levels for different phase of the GST in that cell. The sensed voltage is interpreted to be a logic value. Generally, a set state is defined as a logic level '0', and a reset state is defined as a logic level '1'. However, the specific logic level assigned to a sensed voltage is design dependent. Since the GST changes phases at high temperatures, turning off power to the PCRAM does not affect the phases, and hence the data is non-volatile.

FIG. 1 illustrates a memory cell of a conventional semiconductor memory apparatus including a phase change memory cell.

Referring to FIG. 1, the semiconductor memory apparatus includes a memory unit 110, a programming current driving unit 120, a data reading unit 130, and a global switching unit 140. The memory unit 110 includes a plurality of memory cells MEM_CELL and a plurality of data transfer sections MN10, MN20, and MN30. The plurality of memory cells MEM_CELL are coupled to bit lines BL1, BL2, and BL3 allocated thereto. For reference, the memory cells MEM_CELL comprise a resistive element R1 and a diode D1. The resistive element R1 may be made of a phase change material such as, for example, GST. The plurality of data transfer sections MN10, MN20, and MN30 are coupled between the bit lines BL1, BL2, and BL3 and a global bit line GBL and are selectively turned on in response to selection signals SEL1, SEL2, and SEL3, respectively. Accordingly, data transfer paths are formed between the global bit line GBL and the corresponding bit lines by the turned-on data transfer sections MN10, MN20, and MN30.

When a write enable signal EN_WRITE is activated in a data write mode, the programming current driving unit 120 drives a programming current I_PGM to the global switching unit 140, where the amount of current may depend on which of the write control signals SET_P and RESET_P is asserted. Since the global switching unit 140 is turned on in the data write mode, the programming current I_PGM is supplied to the corresponding memory cell through the global bit line GBL and the specific bit line.

The data reading unit 130 includes a sensing current driving section 131 and a data detection section 132. In the data read mode, the sensing current driving section 131 drives a sensing current I_SENSE to an output node N3. The sensing current I_SENSE flows through the global switching unit 140 to the corresponding memory cell MEM_CELL through the global bit line GBL. The current I_SENSE will induce a voltage across the resistive device R1 of the memory cell MEM_CELL. The voltage level of the output node N3 varies according to the resistance value of the resistive device R1. The data detection section 132 detects the voltage level of the output node N3, compares it to a reference voltage VREF, and outputs read data DATA_READ according.

However, when an excessive sensing current I_SENSE is supplied to the memory cell MEM_CELL, the phase of the resistive device R1 may be changed inadvertently. For example, when the phase change memory cell is supplied with an excessive sensing current I_SENSE in a reset state, it may change to a set state. In order to prevent such a problem, the sensing current driving section 131 includes a clamping transistor MN4. The clamping transistor MN4 adjusts a voltage formed at the memory cell MEM_CELL by limiting the sensing current I_SENSE according to the control of a clamping control signal VCLAMP.

As described above, the conventional semiconductor memory apparatus includes a plurality of current drivers, such as the programming current driving units 120 and the sensing current driving sections 131, which use different operating voltage sources. Therefore, the conventional semiconductor memory apparatus occupies a large circuit area.

SUMMARY

In one embodiment of the present invention, a semiconductor memory apparatus includes: a memory cell; a data transfer unit configured to adjust an access to the memory cell according to a voltage level of a selection signal; a selection signal output unit configured to output the selection signal having a first control voltage level in a data write mode, and output the selection signal having a second control voltage level in a data read mode; and a data detection unit configured to detect a voltage formed by a sensing current supplied to the memory cell through the data transfer unit in the data read mode, and output read data according to the detection result, wherein the second control voltage level is lower than the first control voltage level.

In another embodiment of the present invention, a semiconductor memory apparatus includes: a common current unit configured to drive a sensing/programming current in a data read mode and a data write mode; and a data transfer unit configured to adjust a current limit to a memory cell according to a voltage level of a selection signal, and transfer a current driven by the common current unit to the memory cell.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

For reference, since terms, symbols, and signs that are used in drawings and in this detailed description to designate devices, blocks, and so on may be used for detailed units as the occasion demands, it is to be noted that the same terms, symbols, and signs may not designate the same devices, blocks, and so on in an entire circuitry. Also, the logic signals of a circuit and binary data values are divided into a high level (H) or a low level (L) in correspondence to voltage levels and may be represented as '1' and '0'.

Figure 1:
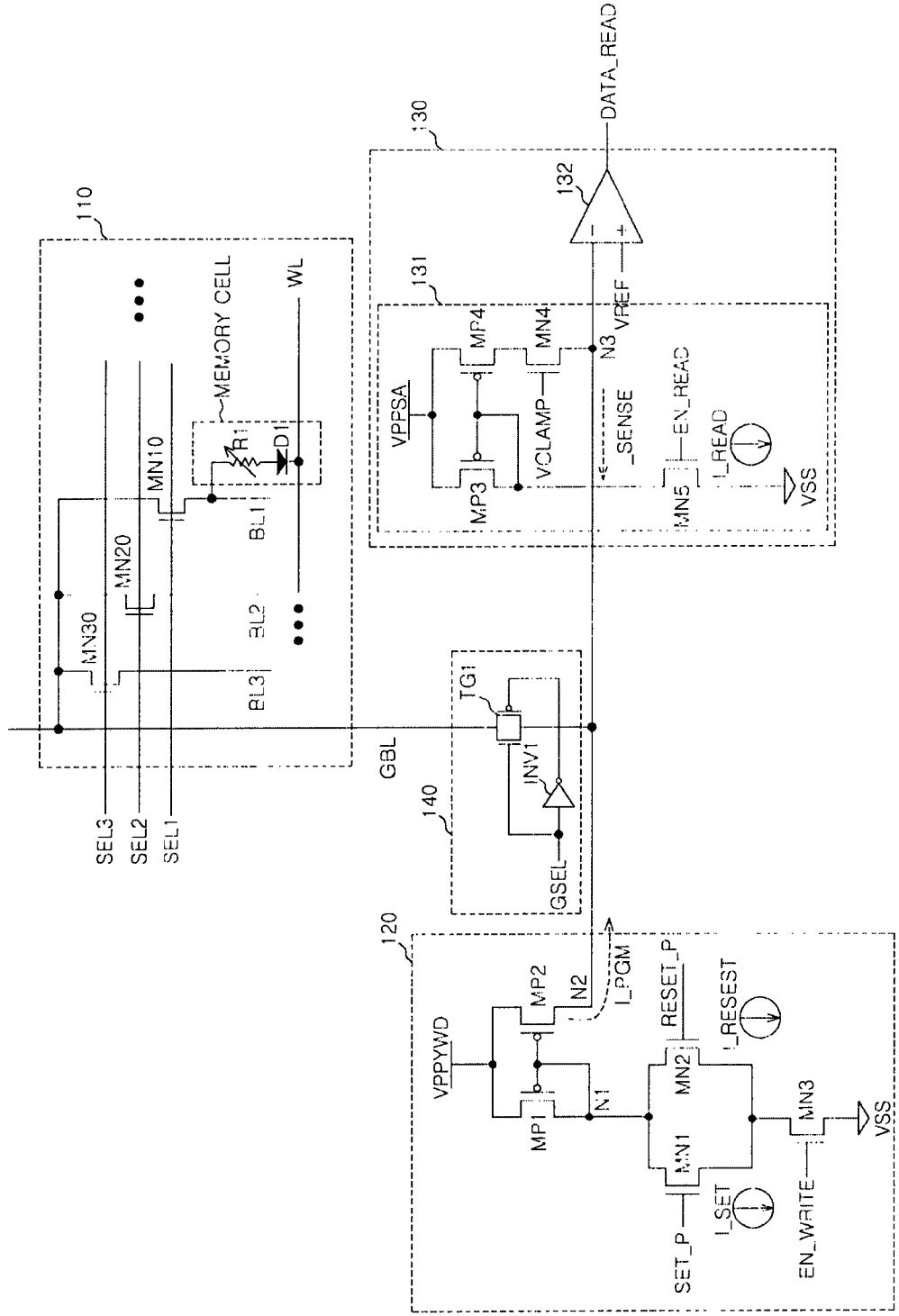
FIG. 1 is a configuration diagram of a conventional semiconductor memory apparatus including a phase change memory cell.
Figure 2:
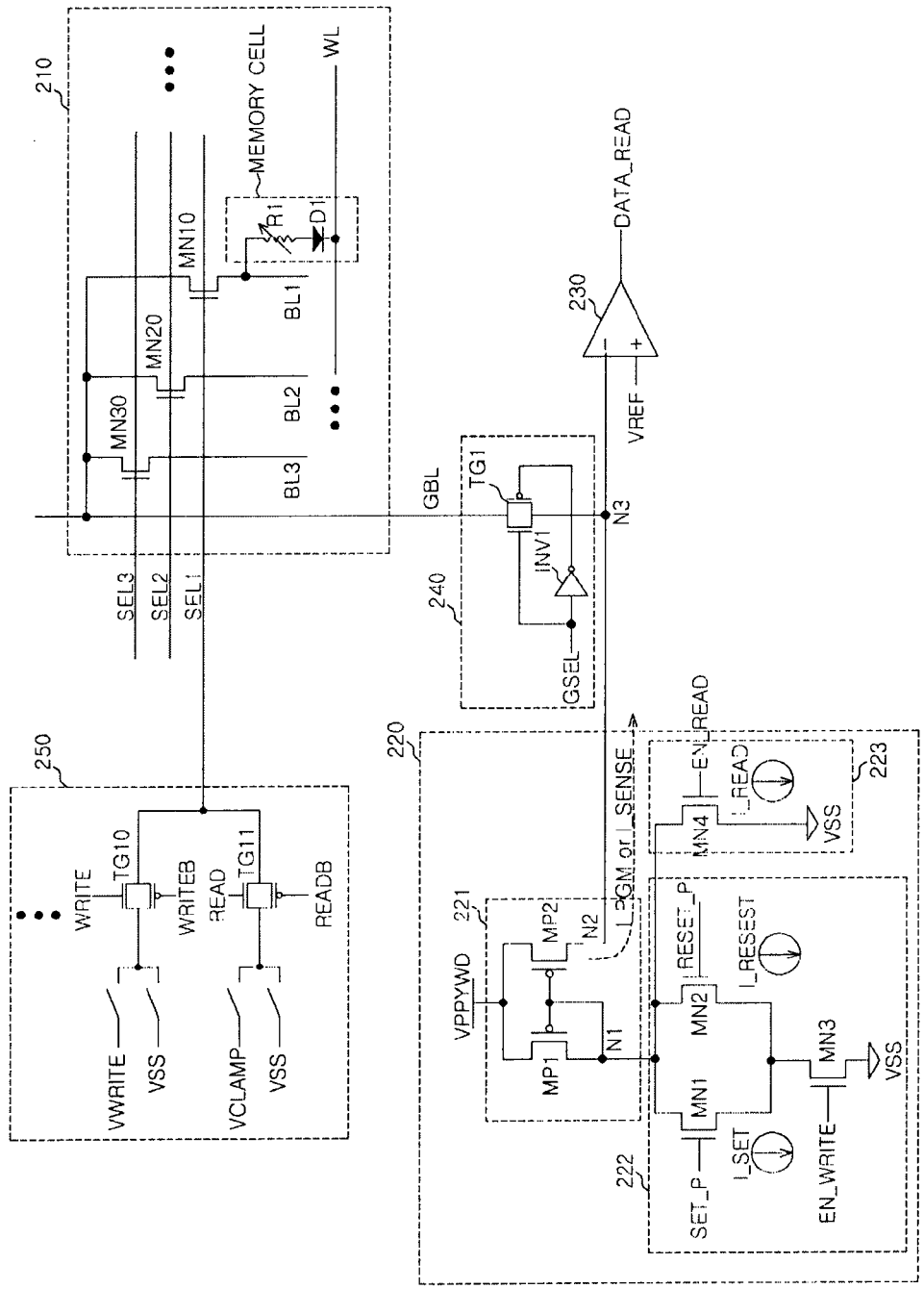
FIG. 2 is a configuration diagram of a semiconductor memory apparatus according to an embodiment of the present invention.

FIG. 2 is a configuration diagram of a semiconductor memory apparatus according to an embodiment of the present invention.

The semiconductor memory apparatus of FIG. 2 according to the embodiment of the present invention has a simplified structure for the sake of clarity. For example, the number of word lines, data transfer units, main memory cells, and bit lines are limited to more clearly explain an embodiment of the present invention.

Referring to FIG. 2, the semiconductor memory apparatus includes a memory unit 210, a common current unit 220, a data detection unit 230, a global switching unit 240, and a selection signal output unit 250.

The detailed structure and main operation of the semiconductor memory apparatus configured as above will be described below.

The memory unit 210 includes a plurality of memory cells MEM_CELL and a plurality of data transfer units MN10, MN20, and MN30. The plurality of memory cells are coupled to a plurality of corresponding bit lines BL1, BL2, and BL3. The memory cells MEM_CELL are phase change memory cells each including a resistive element R1 and a diode D1. The resistive element R1 may comprise phase change material such as, for example, GST. The plurality of data transfer units MN10, MN20, and MN30 are coupled between the allocated bit lines BL1, BL2, and BL3 and a global bit line GBL and controlled by a plurality of selection signals SEL1, SEL2, and SEL3.

The plurality of data transfer units MN10, MN20, and MN30 control an access to each memory cell according to the voltage levels of the selection signals SEL1, SEL2, and SEL3, and transfer a programming current I_PGM or a sensing current I_SENSE, which is sourced by the common current unit 220, to the selected memory cell MEM_CELL.

The main operation of an embodiment of the present invention will be described below, with an exemplary internal operation of the memory cell MEM_CELL coupled to the first bit line BL1, and the first data transfer unit MN10 coupled between the first bit line BL1 and the global bit line GBL.

The first data transfer unit MN10 includes an NMOS transistor MN10 which is coupled between the first bit line BL1, to which the memory cell MEM_CELL is coupled, and the global bit line GBL and controlled by the first selection signal SEL1. Therefore, the NMOS transistor MN10 controls access to the memory cell MEM_CELL according to the voltage level of the first selection signal SEL1.

The selection signal output unit 250 outputs the first selection signal SEL1 having a first control voltage level VWRITE in a data write mode, and outputs the first selection signal SEL1 having a second control voltage level VCLAMP in a data read mode. In this case, the second control voltage level VCLAMP may be set to be lower than the first control voltage level VWRITE. Accordingly, current through the first data transfer unit MN10 may be limited to avoid changing phase of the resistive element R1.

The selection signal output unit 250 includes a first switching section TG10 and a second switching section TG11. The first switching section TG10 outputs the first selection signal SEL1 having the first control voltage level VWRITE in response to data write signals WRITE and WRITEB, and the second switching section TG11 outputs the first selection signal SEL1 having the second control voltage level VCLAMP in response to data read signals READ and READB. In this embodiment, the first switching section TG10 and the second switching section TG11 are implemented with transmission gates.

The voltage level of the first selection signal SEL1 in the data read mode is lower than in the data write mode. Therefore, the first data transfer unit MN10 allows less current to the memory cell MEM_CELL in the data read mode than in the data write mode. Since current to the memory cell is limited, the temperature at the memory cell MEM_CELL is also limited to a point less than needed to change the phase of the resistive element R1, thereby preventing unintended change in the state of the memory cell.

The common current unit 220 drives the sensing current I_SENSE in the data read mode and drives the programming current I_PGM in the data write mode. In this embodiment, the common current unit 220 includes a current driving section 221, a programming current adjustment section 222, and a sensing current adjustment section 223.

The sensing current adjustment section 223 adjusts the voltage level of the control node N1 according to the control of a read control signal EN_READ. The programming current adjustment section 222 adjusts the voltage level of the control node N1 according to the control of the write control signals SET_P and RESET_P. The voltage level of the control node N1 may vary, for example, according to whether the control signal SET_P or the control signal RESET_P is asserted for the respective NMOS transistors MN1 and MN2.

The differing voltage level at the control node N1 due to the controls signal SET_P or the RESET_P may be, for example, due to different current transfer characteristic of the respective NMOS transistors MN1 and MN2 for a given gate voltage. The differing voltage level at the control node N1 due to the control signals SET_P and RESET_P may also be, for example, due to different voltage levels of the asserted control signals SET_P and RESET_P. Various embodiments of the invention may also combine the differing current transfer characteristics of the NMOS transistors MN1 and MN2, as well as the different voltage levels of the asserted control signals SET_P and RESET_P.

The current driving section 221 drives the sensing current I_SENSE or the programming current I_PGM, which corresponds to the voltage level of the control node N1, to an output terminal N2. For reference, an amount of the sensing current I_SENSE is smaller than an amount of the programming current I_PGM.

The data detection unit 230 detects the voltage formed by the sensing current I_SENSE supplied to the memory cell MEM_CELL through the first data transfer unit MN10 in the data read mode, and outputs the read data DATA_READ according to the detection result. The data detection unit may be implemented with, for example, a differential amplifier circuit or a cross-coupled type latch circuit which detects the voltage formed by the sensing current I_SENSE, based on the reference voltage VREF.

The global switching unit 240 forms a data transfer path between the global bit line GBL and the data detection unit 230 in response to a global selection signal GSEL in the data read mode. The global switching unit 240 includes a switching section TG1 controlled by the global selection signal GSEL and is turned on in the data read mode and the data write mode.

In the data write mode, the operation of the semiconductor memory apparatus according to an embodiment of the present invention will be described below.

In the data write mode, the global switching unit 240 is turned on and the first data transfer unit MN10 controls the access to the memory cell MEM_CELL according to the control of the first selection signal SEL1 having the first control voltage level VWRITE.

Also, the common current unit 220 drives the programming current I_PGM and supplies the driven programming current I_PGM to the memory cell MEM_CELL. For reference, the word line WL coupled to the memory cell is biased such that the programming current I_PGM can be transferred through the memory cell.

In the data read mode, the operation of the semiconductor memory apparatus according to an embodiment of the present invention will be described below.

In the data read mode, the global switching unit 240 is turned on and the first data transfer unit MN10 controls the access to the memory cell MEM_CELL according to the control of the first selection signal SEL1 having the second control voltage level VCLAMP. At this time, current to the memory cell MEM_CELL is limited by the second control voltage level VCLAMP to a current that will not allow the memory cell MEM_CELL to reach a temperature where the phase of the resistive element R1 can change.

Also, the common current unit 220 drives the sensing current I_SENSE and supplies the driven sensing current I_SENSE to the memory cell. For reference, the word line WL coupled to the memory cell is biased such that the sensing current I_SENSE can be transferred through the memory cell MEM_CELL. The data detection unit 230 detects the voltage formed by the sensing current I_SENSE, and based on the reference voltage VREF outputs the detection result as the read data DATA_READ.

The semiconductor memory apparatus according to an embodiment of the present invention includes the data read/write common current driving unit using a single operating voltage source, thereby reducing the circuit size thereof. Also, the semiconductor memory apparatus according to an embodiment of the present invention can prevent the occurrence of unintended state change in the memory cell in the data read mode by the data transfer unit being controlled by different voltage levels according to the operation mode. Although the semiconductor memory apparatus including the phase change memory cells has been exemplified in the above embodiments, various embodiments of the invention can also be applied to various types of semiconductor memory apparatuses performing a data read operation through a sensing current.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a memory cell;
   a data transfer unit configured to control flow of current to the memory cell according to a voltage level of a selection signal;
   a selection signal output unit configured to output the selection signal having a first control voltage level in a data write mode and a second control voltage level in a data read mode; and
   a data detection unit configured to detect a voltage formed by a sensing current supplied to the memory cell through the data transfer unit in the data read mode, and output read data according to the detection result,
   wherein the second control voltage level is lower than the first control voltage level.

2. The semiconductor memory apparatus according to claim 1, wherein an electrical state of the memory cell is reversibly changed by Joule heating.

3. The semiconductor memory apparatus according to claim 1, wherein the memory cell comprises phase change material.

4. The semiconductor memory apparatus according to claim 1, wherein the data transfer unit comprises a transistor which is coupled between a bit line, to which the memory cell is coupled, and a global bit line, and is controlled by the selection signal.

5. The semiconductor memory apparatus according to claim 4, further comprising a global switching unit configured to form a data transfer path between the global bit line and the data detection unit in response to a global selection signal.

6. The semiconductor memory apparatus according to claim 1, wherein the selection signal output unit comprises:
   a first switching section configured to output the selection signal having the first control voltage level in response to a data write signal; and
   a second switching section configured to output the selection signal having the second control voltage level in response to a data read signal.

7. A semiconductor memory apparatus comprising:
a common current unit configured to drive a sensing/programming current in a data read mode and a data write mode; and
a data transfer unit configured to adjust a current limit to a memory cell according to a voltage level of a selection signal, and transfer a current driven by the common current unit to the memory cell.

8. The semiconductor memory apparatus according to claim 7, further comprising a data detection unit configured to detect a voltage formed by the sensing/programming current supplied to the memory cell in the data read mode, and output read data according to the detected voltage.

9. The semiconductor memory apparatus according to claim 7, further comprising a selection signal output unit configured to output the selection signal having a first control voltage level in the data write mode and a second control voltage level in the data read mode,
wherein the second control voltage level is lower than the first control voltage level.

10. The semiconductor memory apparatus according to claim 9, wherein the selection signal output unit comprises:
a first switching section configured to output the selection signal having the first control voltage level in response to a data write signal; and
a second switching section configured to output the selection signal having the second control voltage level in response to a data read signal.

11. The semiconductor memory apparatus according to claim 7, wherein the common current unit comprises:
a first sensing/programming current adjustment section configured to adjust a voltage level of a control node according to control of a read control signal;
a second sensing/programming current adjustment section configured to adjust the voltage level of the control node according to control of a write control signal; and
a current driving section configured to drive the sensing/programming current, which has a magnitude corresponding to the voltage level of the control node, to an output terminal.

12. The semiconductor memory apparatus according to claim 11, wherein the second sensing/programming current adjustment section comprises:
a first current adjustment section configured to adjust the voltage level of the control node according to control of a set signal; and
a second current adjustment section configured to adjust the voltage level of the control node according to control of a reset signal.

13. The semiconductor memory apparatus according to claim 12, wherein the first current adjustment section comprises a first NMOS transistor and the second current adjustment section comprises a second NMOS transistor.

14. The semiconductor memory apparatus according to claim 13, wherein the first NMOS transistor has different current transfer characteristic than the second NMOS transistor for a given control gate voltage.

15. The semiconductor memory apparatus according to claim 12, wherein the set signal has a different voltage level than the reset signal.

16. The semiconductor memory apparatus according to claim 7, wherein an electrical state of the memory cell is reversibly changed by Joule heating.

17. The semiconductor memory apparatus according to claim 7, wherein the memory cell comprises phase change material.

18. The semiconductor memory apparatus according to claim 7, wherein the data transfer unit comprises a transistor coupled between a bit line, to which the memory cell is coupled, and a global bit line, and is controlled by the selection signal.

19. The semiconductor memory apparatus according to claim 18, further comprising a global switching unit configured to form a data transfer path between the global bit line and a data detection unit in response to a global selection signal.

20. The semiconductor memory apparatus according to claim 7, wherein the sensing/programming current is smaller in a data read mode than in a data write mode.

* * * * *